United States Patent [19]

Namysl

[11] Patent Number: 4,806,195
[45] Date of Patent: Feb. 21, 1989

[54] PRINTED CIRCUIT BOARD LAMINATING MACHINE

[76] Inventor: Edmond Namysl, 1907 Frederick, Placentia, Calif. 92670

[21] Appl. No.: 101,850

[22] Filed: Sep. 28, 1987

[51] Int. Cl.[4] .................. B32B 31/04; B32B 31/20
[52] U.S. Cl. .................. 156/382; 100/269 A; 156/583.3
[58] Field of Search ............ 156/285, 286, 382, 583.3, 156/379.8, 380.6, 380.9, 381, 499, 556, 583.1, 273.7; 100/269 A; 425/389, 405 R, D 19; 264/500, 510, 570

[56] References Cited

U.S. PATENT DOCUMENTS

| | | | |
|---|---|---|---|
| 2,148,704 | 2/1939 | Merritt | 100/269 A |
| 2,536,713 | 1/1951 | Berg | 156/580 |
| 2,662,960 | 12/1953 | Williams | 156/583.1 |
| 2,945,976 | 7/1960 | Fridrich et al. | 156/285 |
| 3,190,215 | 6/1965 | Howard et al. | 100/269 A |
| 3,818,823 | 6/1974 | Bond | 156/285 |
| 4,127,436 | 11/1978 | Friel | 156/285 |
| 4,447,282 | 5/1984 | Valerio et al. | 156/285 |
| 4,700,474 | 10/1987 | Choinski | 156/382 |

FOREIGN PATENT DOCUMENTS

| | | | |
|---|---|---|---|
| 145312 | 5/1950 | Australia | 156/285 |
| 853651 | 8/1952 | Fed. Rep. of Germany | 156/382 |
| 316134 | 10/1930 | United Kingdom | 156/286 |

Primary Examiner—Merrell C. Cashion, Jr.
Attorney, Agent, or Firm—G. Donald Weber, Jr.

[57] ABSTRACT

There is shown and described a relatively simple method and apparatus for laminating dry films onto printed circuit boards. The apparatus is a relatively low-cost device which uses vacuum or atmospheric pressure and temperature for performing a laminating operation and is especially adapted for use in custom printed circuit board fabrication techniques.

16 Claims, 3 Drawing Sheets

PRINTED CIRCUIT BOARD LAMINATING MACHINE

BACKGROUND

1. Field of the Invention

This invention is directed to a method and apparatus for laminating dry films onto printed circuit boards, in general, and to a relatively inexpensive method and apparatus for laminating the films to printed circuit boards in an inexpensive manner, in particular.

2. Prior Art

The use of dry films in the preparation of printed circuit boards is well known in the art. The dry film technique has been used for several years and is used instead of other techniques which include the placement of a liquid form of material on a printed circuit board to act as a mask. The wet film or liquid layer technique has many disadvantages which are known in the art. These disadvantages include lack of uniformity, poor registration, filling in between the circuit traces and so forth.

The dry film technique has been used to avoid some of the liquid film techniques. In the dry film technique it is usual that large rolls of a "dry film" are placed adjacent to a machine and fed into the macine automatically or semi-automatically, placed next to the printed circuit board and treated appropriately. However, there are only a small number of these types of machines available. These machines are generally quite large and expensive and are not usually suitable or economically feasible for small circuit board houses or the application of small lots of custom circuit boards. A typical example of a known dry film device is the Dupont dry film solder mask vacuum laminator.

As is well known in the art, these dry film techniques are very expensive and difficult for the average circuit board house to amortize. Thus, in the past, small circuit board houses (i.e. relatively small establishments which make printed circuit-board products in small quantities) which wish to use dry film techniques have encountered substantial labor-intensive activities insofar as the films must be placed on the circuit boards by a hot roll laminator and moved, removed, or the like. Even with diligent care, this part of the operation is frequently performed less than perfectly which results in the dry film being placed on the printed circuit board improperly so that defective circuit boards are produced as a result. For example, applying a dry film solder mask to an etched printed circuit board with a hot roll laminator normally results in poor encapsulation of the circuit traces, poor adhesion, trapped air between the traces, and excessive blistering during the wave soldering and hot solder coating operations. The blistering and flaking of dry film off of the circuit board during the hot solder coating operation contaminates the solder bath so that the circuit board cannot be fabricated in the wave solder apparatus.

SUMMARY OF THE INVENTION

This invention is directed to a method and apparatus for laminating dry films to printed circuit boards. The method and apparatus permits the dry film to be applied to the circuit board in a routine fashion. The circuit board is then entered into the subject apparatus and heated. The film is applied to the board and subjected to appropriate pressure so that the film is laminated to the circuit board in a highly accurate fashion thereby to provide excellent adhesion, encapsulation of the circuit traces, and filling of the spaces between the circuit traces with film and without entrapped air.

DESCRIPTION OF A PREFERRED EMBODIMENT

Figure 1:
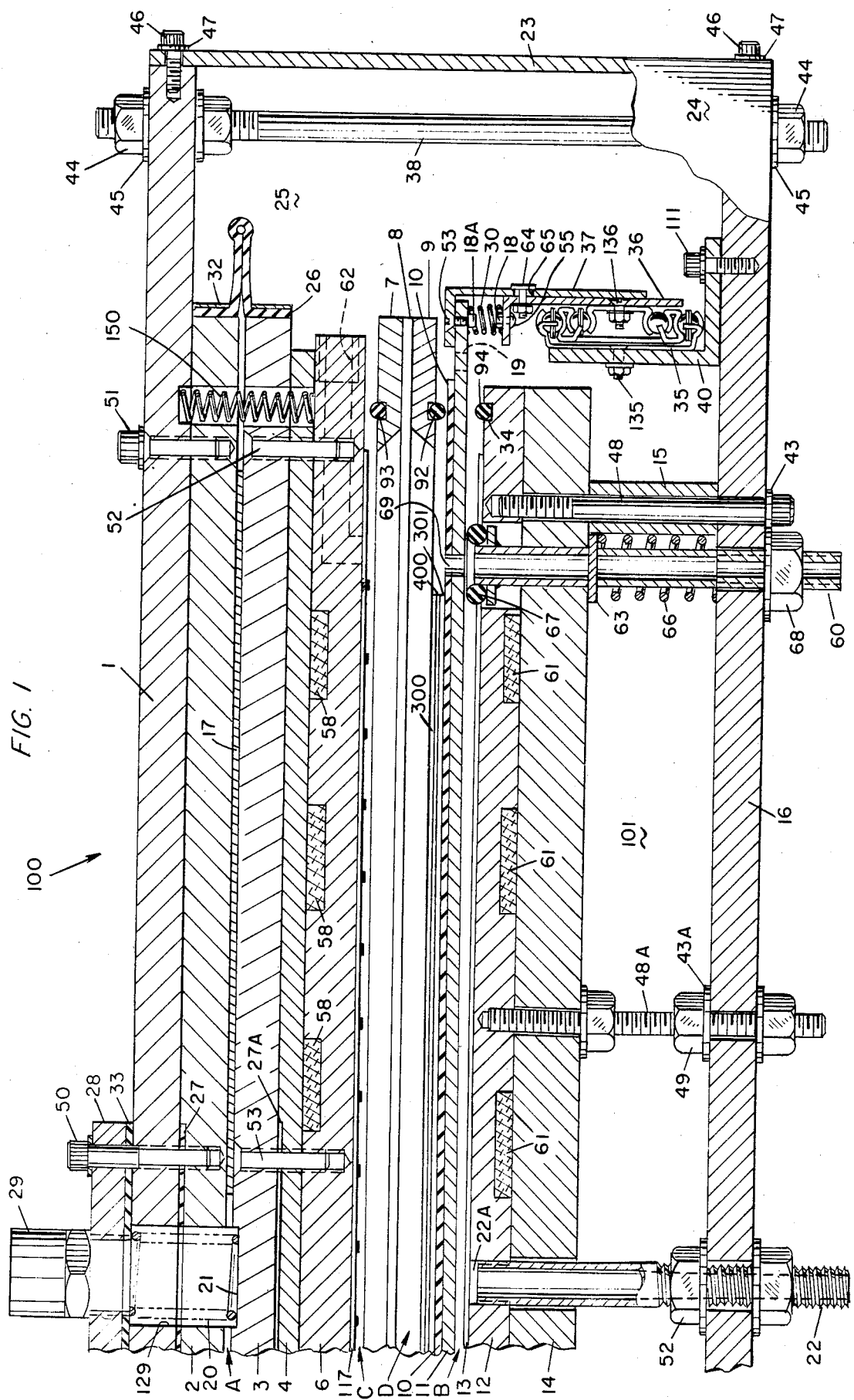
FIG. 1 is a front, cross-sectional view of one half of a preferred embodiment of the laminator apparatus of the instant invention.

Referring now to FIG. 1, there is shown a front, cross-sectional view of one half of a preferred embodiment of the instant invention. The other half is substantially identical. In FIG. 1, the apparatus is shown in significant detail with virtually all components visible for description. However, some of the components of the apparatus are depicted out of place for convenience only.

In this embodiment, a suitable case or cabinet 100 is provided with a slide-out drawer 101 shown generally. The cabinet 100 is not necessarily a part of the invention, per se, but provides a suitable support and housing mechanism for the laminating apparatus of the invention. In a preferred embodiment, the cabinet 100 includes an upper casing plate 1 and a lower casing plate 16. Each of the plates can be fabricated of a suitable material such as aluminum or the like with the appropriate thickness and strength. The cabinet also includes side plates 23 (one on each side). The side plates 23 is mounted to the upper and lower casing plates by suitable screws 46 and washers 47 or the like. Front plate 24 is shown broken away for convenience. Rear plate 25 provides a closure for the cabinet. The front and rear plates have appropriate dimensions and are included to enclose the apparatus. The front and rear plates are mounted to the upper and lower casing plates by suitable means.

The upper and lower casing plates 1 and 16, respectively, are further mounted on and separated by the spacers 38 which can be threaded at the opposite ends thereof to receive the nuts 44 and appropriate flat and/or lock washers 45. Of course, if other fabrication and assembly techniques are provided, the various screws, nuts and bolts can be eliminated and the assembly can be welded, molded or the like. However, the spacer method is preferrable inasmuch as this technique permits ready adjustment and yet maintains the proper positioning of the casing plates 1 and 16 when assembled. In addition, with the spacer construction, other relationship of components are more easily accommodated and tolerance conditions are more readily achieved. While FIG. 1 shows only one spacer 38, it is understood that in the preferred embodiment such spacers are provided, four on each side of the apparatus. The spacers 38 provide rigidity and structural strength for the apparatus.

In a preferred embodiment, the assembly includes a drawer arrangement 101 wherein access to the internal portion of the mechanism can be achieved. (Again, only one half of the drawer apparatus 101 is shown, for convenience.) In the embodiment shown, the drawer slide apparatus includes mounting brackets 40 which are mounted to the lower casing plate 16 by appropriate screws and washers 111. The drawer includes a slide 35 for each side thereof. Each slide incorporates ball bearing rollers therein to permit easy movement of the drawer slides. The slides are fastened to the slide support mouting brackets 40 in any suitable fashion such as nuts and bolts, screws, welding or the like. Flat head screw 135 is representative of such a fastening technique. In some cases, the slides 35 may include the mounting brackets 40 as integral parts thereof.

Each of the slide bracket supports 36 is connected to a slide 35 by means of a flat head screw 136. Slide bracket support 36 is arranged to move with slide 35. In addition, slide bracket support 36 is connected to slide bracket 37 by means of a rectangular slide pin 64 which passes through rectangular slot 65 in slide bracket 37. This permits controlled or guided vertical adjustment or movement of the slide bracket 37, if required.

In addition, slide bracket 37 is connected to and supports the laminating platform 11. In particular, screw 55 passes through an aperture in slide bracket support 36 and secures spring rod 18. A compression coil spring 30 encircles and is mounted on spring rod 18. The other end of spring 30 encircles and is mounted on spring rod 18A which is mounted to the bottom of laminating platform 11 by screw 53 which passes through bracket 37 and platform 11. Slide bracket 37 has an inverted L-shape and limits the movement of platform 11 by abutting the upper surface of platform 11. Slide bracket 37 is, of course, movable with platform 11 and is described hereinafter. With this construction, platform 11 can be adjusted vertically by spring 30 which bears upon slide brackets 37 and 36. These brackets are adapted for vertical adjustment through the arrangement of pin 64 and slot 65 described above.

The platform 11 comprises a plate which extends across the area of the laminating machine from one slide apparatus 35 to the other and from the front of the drawer to the back thereof. Platform 11 is, typically, fabricated of aluminum or other suitable material and supports a rubber pad 10 of silicone rubber, or the like thereon. It is this platform onto which a printed circuit board 400 is placed during the laminating operation of the apparatus. In a preferred embodiment, platform 11 has a plurality of elongated slots therethrough arranged adjacent to each side or edge of the platform. This arrangement of the slots inhibits warping of platform 11 during operation of the laminating apparatus.

A support apparatus is mounted in the laminating machine to establish the structure thereof. In one embodiment, this support includes a plurality of screws or bolts 48 which pass through apertures in the lower casing plate 16 and through appropriate stand-off mechanisms 15. The stand-offs 15 support thermal insulator plate 14 through which the screws 48 pass. A pressure plate 12 is threaded to receive the internal ends of screws 48 so that the entire support mechanism is firmly positioned relative to lower casing plate 16. Lock washers 43 retain these screws securely in position.

In an alternative embodiment, plates 12, 14 and 16 may be mounted by using threaded rods 48A which are attached to pressure plate 12 and pass through insulator plate 14 and base plate 16. A plurality of nuts 49 and lock washers 43A provide adjustable positioning devices for the plates 12 and 14 relative to base plate 16.

Heater element 61, which may comprise a plurality of strip heaters, is mounted at pressure plate 12. The heater element 61 is connected to receive power, typically, electrical power from a suitable source (not shown) in order to generate heat during the laminating process. The heater (or strip heaters) may be mounted in the direction shown or at 90° thereto or any other desirable position. In an alternative embodiment, a heater blanket 13 may be utilized in lieu of, or in conjunction with, the heater elements 61. In the preferred embodiment, the heater strips 61 are imbedded in plate 12. However, a surface mounting arrangement is also contemplated.

The upper surface of pressure plate 12 includes a slot in the upper surface thereof an adjacent to the periphery of the plate. Slot or groove 34 is adapted to receive a grommet or gasket 94 which provides a seal for chamber B as described hereinafter.

The upper casing plate 1 is attached to an upper bellows plate 2 by screws 50 and 51. In this embodiment, plate 2 is a circular plate which serves as the upper half of a bellows (as described hereafter). Screw 50 passes through port mounting plate 28 which is used to support port 29 which communicates with chamber A of the bellows as described hereinafter. A gasket 33 is disposed between plate 28 and upper casing plate 1 to provide an air-tight seal, especially with regard to port 29.

A lower bellows plate 3 is mounted beneath plate 2 and is substantially co-extensive therewith. Plate 3 is the lower plate of the bellows. In this embodiment, a thin perforated sheet 17 is disposed between plates 2 and 3 in order to permit faster separation of the bellows plates by admitting air into the space more freely. The sheet 17 can be a screen or expanded metal element, formed of aluminum or other suitable material.

Screws 53 pass through apertures in lower bellows plate 3 and, as well, the thermal insulator plate 4. Rectilinear pressure plate 6 is mounted at the ends of screws 53. Heater elements 58, similar to heater elements 61, are included in or on pressure plate 6. A spacer 117 (see FIG. 10) is disposed on the inner surface of pressure plate 6 to provide a spacer function similar to perforated sheet 17. In addition, gasket 27 is disposed between plates 1 and 2 while gasket 27A is disposed between plates 3 and 4, respectively, to provide suitable sealing therebetween.

Port 29 communicates with a bore 129 which passes through plates 1 and 2. The port 29 and bore 129 communicate with chamber A (noted above) which is defined as the space within bellows 26 and between upper and lower bellows plates 2 and 3.

The bellows 26 is affixed to the outer circumference surface of each of plates 2 and 3 and includes a portion returned upon itself to permit expansion thereof in a bellows-like operation. The bellows 26 can be adhered to plates 2 and 3 or, alternatively, a band clamp 32 can be used for this mounting. Bellows 26 defines the outer periphery of chamber A.

A compression spring 20 is mounted in port 129 between the under surface of gasket 33 and a mounting well 21 in the upper surface of lower bellows plate 3. As described hereinafter, spring 20 assists in forcing lower bellows plate 3 away from upper bellows plate 2 when a vacuum is not pulled in chamber A.

Springs 150 are mounted between the upper surface of the corner of pressure plate 6 and the lower surface of upper casing plate 1 adjacent the arcuate edge defined by the circular configuration of plates 2 and 3. The springs 150 are arranged to be under compression so as to normally impart a force against plate 6 whereby plate 6 is biased to move away from casing plate 1.

Port 22 passes through apertures in plates 16, 14, and 12 and communicates with chamber B which is defined between the upper surface of pressure plate 12 and the lower surface of platform 11. A sealing grommet 22A is disposed at the inner end of port 22 to selectively form a seal with platform 11. (Thus, when laminating platform 11 is drawn into contact with seal 22A by application of a vacuum in chamber B (via port 22), the grommet 22A forms an airtight seal.) Port 22 which may comprise a suitable conduit, is mounted in lower casing plate 16 by suitable nuts and washers 52.

Port 62, is a horizontal bore which passes through plate 6. In this illustration, port 62 is shown dashed inasmuch as it is, typically, arranged to extend to the rear of the apparatus. The arrangement shown in FIG. 1 is primarily for convenience in illustration. The position of port 62 is not critical so long as it communicates with chamber C. In this embodiment chamber C is defined between the lower surface of pressure plate 6 and the upper surface of diaphragm 8 which is mounted between upper frame 7 and lower frame 9.

In a preferred embodiment, diaphragm 8 is a glass-cloth-reinforced silicone-rubber blanket which is vulcanized to upper frame 7 and lower frame 9. The frames 7 and 9 have slanted inner edges to accomodate the diaphragm 8 when it flexes as described hereinafter. In addition, lower frame 9 includes a groove or slot for receiving O-ring 92 which acts as a vacuum seal for space D, as described hereinafter. Likewise, upper frame 7 includes a groove for receiving grommet 93 which acts as a vacuum seal for space C, as described hereinafter. The diaphragm 8 and frame are mounted between pressure plate 8 and laminating platform 11.

Another port 60 passes through the plates 16, 14 and 12. A collar 63 is affixed to port 60 to provide a bearing surface for spring 66. The spring 66 acts to position port 60 inwardly within tolerances which may be experienced with the components. A nut 68 is used to mount port 60 to base plate 16. A grommet 67 is mounted in a groove in plate 12 and surrounds port 60. An aperture 69 passes through platform 11 and pad 10 immediately adjacent to the inner end of port 60. Thus, port 60 selectively communicates with chamber D which is defined between diaphragm 8 and pad 10 on platform 11. The grommet 67 selectively seals chamber D from chamber B.

A printed circuit board 400 is shown on the upper surface of the laminating platform 11. Dry film solder masks 300 and 301 are shown on opposite sides (surfaces) of the printed circuit board.

Figure 2:
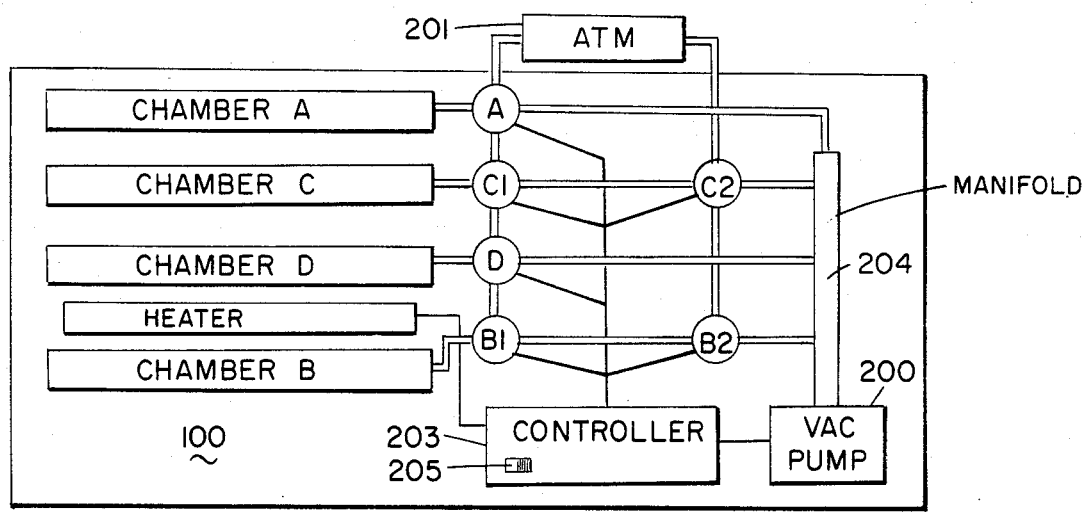
FIG. 2 is a schematic illustration of the apparatus showing the respective pressure chambers and valves.

Referring now to FIG. 2, portions of appropriate control and operating mechanism which are related to the apparatus of this invention are shown schematically. For example, a vacuum source 200 is utilized to selectively draw a vacuum in the chambers A through D shown in FIG. 1. Also, a positive pressure source 201 can be arranged to selectively supply a positive pressure in the chambers. In the preferred embodiment the positive pressure is atmospheric pressure which is readily achieved by removing the vacuum. Thus, the potential hazard of a pressurized system is avoided in this embodiment.

In order to control the vacuum/pressure status in any particular chamber, a controller apparatus 203 is required. The control apparatus is preferably composed of an electronic control system which is arranged to supply control signals in a desired sequence in order to operate the respective valves connected between the positive and negative pressure systems and the chambers. In addition, the controller apparatus 203 activates the heater elements and control sthe operating sequence of the valves.

Thus, as will be described in greater detail hereinafter, valves A, B1, B2, C1, C2 and D are provided in a preferred embodiment. These valves are associated with the chamber having the same letter designation. Each of these valves is connected between vacuum pump 200 and the respective chamber A, B, C or D. A manifold 204 can be used to provide distributive connections to the vacuum pump 200, if desired. In addition, the valves are connected to the ambient atmosphere so that the related chamber receives either atmospheric pressure or vacuum, as determined by the valve position. Typically, the valves are controlled by solenoids whereby the positions of the valves and the operating sequences are controlled by controller 203 and the electronic circuitry therein. The relationship between the valves and the pressure status is shown in Table I. The particular control apparatus is not described in detail.

TABLE I

| VALVE | EXHAUST STATUS | CONNECTED TO |
|-------|----------------|--------------|
| A | OPEN | VAC PUMP |
| B1 | OPEN | B2 |
| B2 | PLUGGED | VAC PUMP |
| C1 | OPEN | C2 |
| C2 | PLUGGED | VAC PUMP |
| D | OPEN | VAC PUMP |

The mechanical elements of the laminating apparatus are identical in FIGS. 3 through 7. However, the operating position of some of the parts is changed as the machine is operated wherein the printed circuit board and related film materials are being operated upon. This operation is best shown by viewing the several Figures, which have been simplified for convenience but which show the major components of the apparatus during an operating cycle. That is, some of the structural details shown in FIG. 1 have been omitted relative to FIGS. 3–7, inclusive. Moreover, the cross-hatching is for visual aid and is not necessarily intended to signify any particular materials. Nevertheless, it is understood that similar components bear similar reference numerals.

Figure 3:
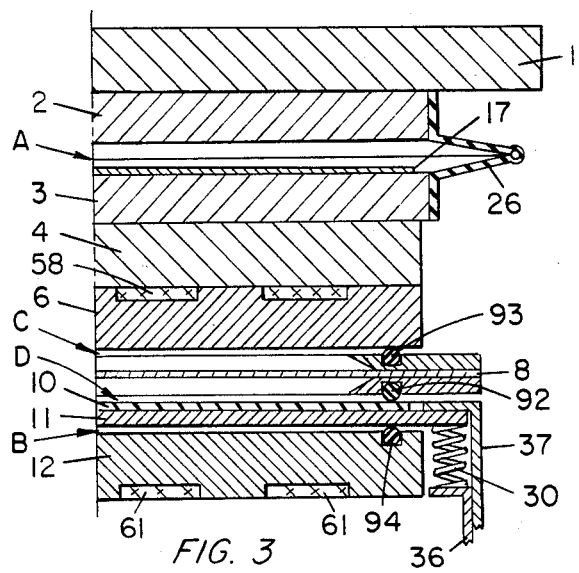
FIGS. 3 through 7 are partial, schematic cross-sectional views of the laminator apparatus of the instant invention at various stages in the operation thereof.

Referring particularly to FIG. 3, the macine is in the "neutral" position which is, essentially, established prior to the actual operation of the system. That is, switch 205 of the apparatus is operated to energize controller 203 (see FIG. 2) but no vacuum conditions are initiated and the system status is determined by "ambient" conditions, i.e. atmospheric pressure, inherent spring forces and the like.

Thus, chambers A, B, C and D are all open via the respective ports, channels, valves or the like to receive ambient, atmospheric pressure. In particular, the bellows 26 is relaxes so that the lower bellows plate 3, insulator plate 4 and pressure plate 6 move downwardly under the influence of gravity and compression springs 150 (see FIG. 1).

Pressure plate 6 abuts against (but does not compress) the grommet or O-ring 93 in groove 7A in the upper frame 7 to form chamber C. Likewise, the grommet or O-ring 92 in groove 9A in the lower frame 9 abuts against (but is not compressed) by the rubber pad 10 thereby to form chamber D.

Rubber pad 10 is disposed on the upper surface of laminating platform 11. The lower surface of platform 11 abuts with but does not compress grommet or O-ring 94 in the groove in pressure plate 12 to form chamber B. In this arrangement, the apparatus is ready for operation when activated.

Typically, the operation of the apparatus is initiated by the controller 203 which includes a timer for establishing the proper sequence of activities. For example, turning on the controller to begin system operation will, initially, turn on the heater elements 58 and 61 in the plates 12 and 6, respectively. These heaters are instrumental in providing the necessary laminating temperature.

Figure 4:
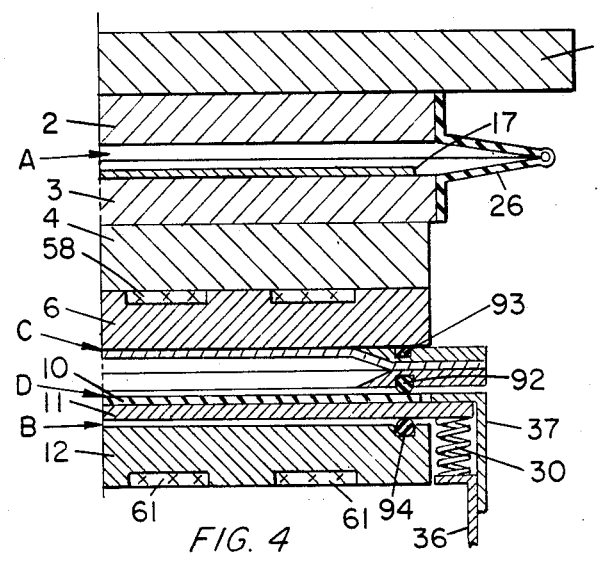

Referring now to FIG. 4, a vacuum is pulled in chamber C between pressure plate 6 and diaphragm 8 through port 62. In the actual embodiment, port 62 communicates with chamber C via a conduit through pressure plate 6 to one edge thereof (see FIG. 1). By pulling a vacuum in chamber C, the diaphragm 8 is drawn upwardly against the lower surface of pressure plate 6. This action also draws upper frame 7 into contact with pressure plate 6 whereupon grommet 93 is compressed to complete the seal of chamber C. This operation is, effectively, achieved by activating valves C1 and C2 (See FIG. 2) and thereby connecting the vacuum pump 200 to the chamber C.

Figure 5:
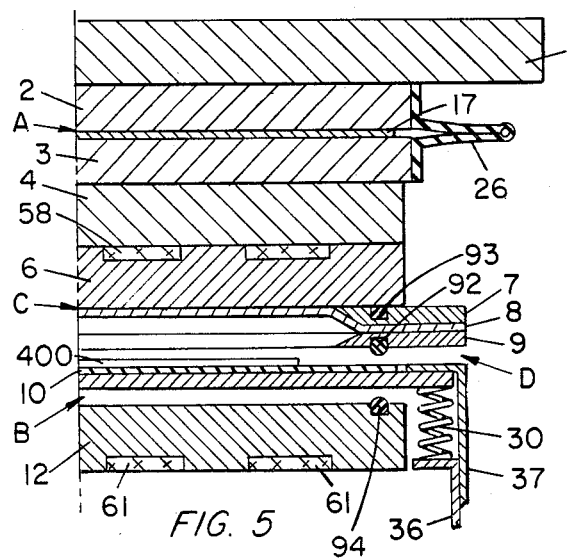

By next pulling a vacuum in chamber A, the bellows 26 closes as shown in FIG. 5 and thereby lifts frames 7 and 9, together with diaphragm 8, upwardly away from laminating platform 11 and rubber pad 10. Springs 30 tend to push platform 11 upwardly whereby the platform is displaced from any contact with plate 12. The upward movement of platform 11 is limited by the interaction of pin 64 and rectangular slot 65 in slide bracket 37. (It will be seen that the springs 30 force the drawer 100 upwardly out of contact with plate 12 but not far enough to contact frame 9.) In this condition, the drawer apparatus 101 is free to slide outwardly on slides 35A and the associated brackets including runners 36 and 37. The drawer 101 will open in a cantilevered or suspended fashion, as is well known in the art. This slide operation can be performed manually or automatically depending upon the design of the system. With the drawer open, the circuit board 400 is placed on the silicone rubber pad 10. Tyically, the PCB 400 is placed between two layers of dry film 300 and 301. (Of course, a single layer of dry film can be used, as well). Approximate registration is desired but exact registration, at this point, is not essential.

It will be noted that in the "open" condition of the system shown in FIG. 5, plates 2 and 3 are, bascially, in contact with the perforated sheet 17 which, in the preferred embodiment, comprises a thin perforated sheet of aluminum. Otherwise, the bellows 26 is, effectively, closed. The perforated sheet 17 functions as a "bleeder" to permit fast separation of plates 2 and 3 when atmospheric pressure is returned to chamber A via port 29 and bore 129, as described hereinafter. Thus, chamber A, between the lower surface of upper bellows plate 2 and the upper surface of lower bellows plate 3 is minimal. In addition, the lower surface of pressure plate 6 continues to abut diaphragm 8 and the upper surface of upper frame 7 and forms a seal with the grommet or O-ring 93.

It is seen that chamber D exists between the lower surface of diaphragm 8 and the upper surface of the platform 11, as well as the printed circuit board 400 and dry film 300 disposed thereon. Chamber B also exists between the upper surface of pressure plate 12 (with the heater elements 58) and the lower surface of platform 11. Both chambers B and D are, in this case, open to atmospheric (or ambient) pressure through the valves B1, B2 and D (see FIG. 2). Thus, the circuit board and dry film can be inserted readily onto platform 11 and the drawer returned to position within the apparatus. Thus, the system is ready to start the laminating procedure.

Figure 6:
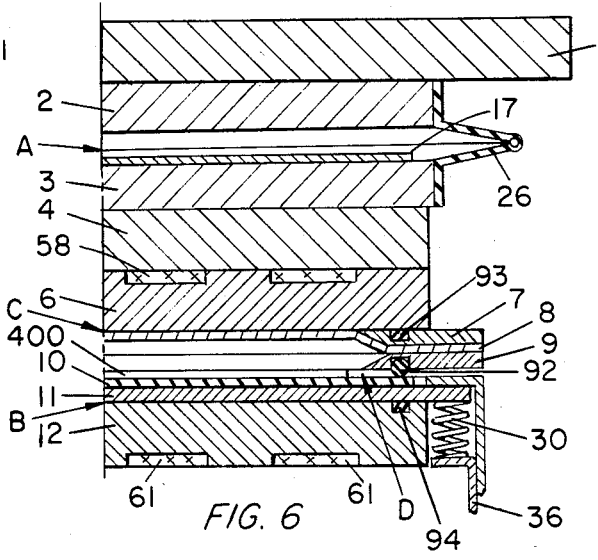

Referring now to FIG. 6, the procedure is described further. Thus, valve A (see FIG. 2) is opened to the positive pressure source 201 whereby the vacuum is removed from port 29 and atmospheric pressure is released into chamber A. Thus, plates 3 and 6, together with insulator plate 4, move downwardly. Chamber A then expands as the bellows 26 relaxes. Simultaneously, spring 20 (see FIG. 1) pushes against lower bellows plate 3, thereby pushing the lower surface of pressure plate 6 against upper frame 7. This action, in turn, causes grommet 99 to abut against platform 11 and pad 10 in order to form a seal for chamber D. Concurrently, platform 11 moves downwardly so that grommet 94 forms a seal between platform 11 and pressure plate 12 to form chamber B.

At that time, port 22 (see FIG. 1) is connected to the vacuum pump 200 which pulls a vacuum in chamber B between the lower surface of platform 11 and the upper surface of pressure plate 12. As a result, grommet 94 becomes compressed thereby increasing the sealing effect relative to chamber B. The heaters at pressure plate 12 have been previously energized. Consequently, this operation has the effect of applying heat to the circuit board 400 and the dry film 300 being laminated.

Figure 7:
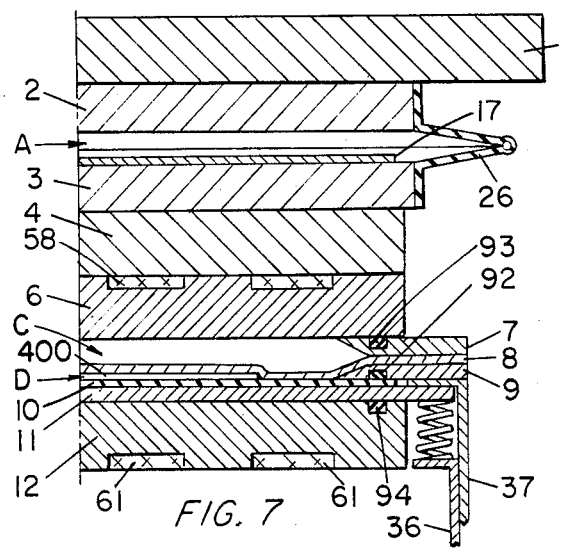

Referring now to FIG. 7, a vacuum is pulled in chamber D through outlet 60 (which is connected to valve D) in pressure plate 12, insulator plate 14 and laminating platform 11. This causes pressure plate 6 and upper frame 7 to move downwardly so that the grommet 92 engages the upper surface of rubber pad 10 to form a seal therewith. Also, substantially no atmosphere remains in chamber D so that air pockets are avoided.

After the seal has been formed by grommet 92 between lower frame 9 and pad 10 (or platform 11), chamber C is disconnected from the vacuum pump by opening valve C1 (while keeping valve C2 closed) whereupon ambient atmospheric pressure fills chamber C. This, coupled with the vacuum in chamber D, causes diaphragm 8 to "slap" down onto the pre-heated circuit boasrd 400 and the dry films 200 and 301. Thus, the lamination occurs under heat from the heaters and pressure from diaphragm 8. Because chamber D is evacuated, the diaphragm closely follows the contour of the PCB whereby a high quality lamination of the films to the PCB occurs.

Subsequently, port 22 is connected to provide ambient atmospheric pressure in chambers B and D thereby returning diaphram 8 to its "neutral" position and effectively releasing platform 11. Vacuum is again applied to chamber C to cause diaphragm 8 to be drawn upwardly into contact with pressure plate 6. At this juncture the lamination cycle is complete and vacuum is drawn in chamber A to close bellows 26. This removes the upper pressure plate 6 and frames 7 and 9 from contact with the laminating platform 11 and returns the apparatus to the position shown in FIG. 5. Another cycle can now be performed.

Figure 8:
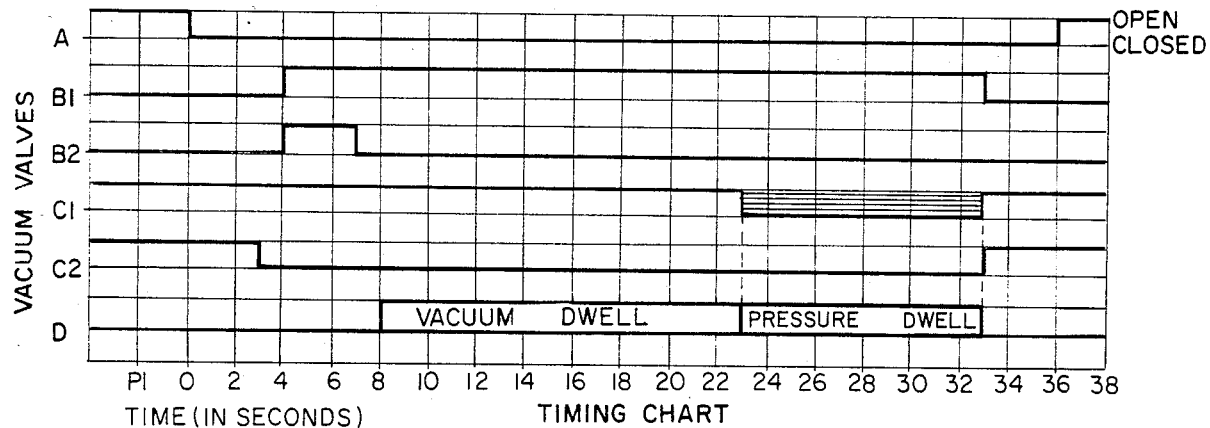
FIG. 8 is a timing chart which illustrates the relative operation of the portions of the apparatus.

The rudimentary timing timing diagram shown in FIG. 8 is used to show the sequence of the respective operations of the apparatus. A timing scale for the operating cycle is shown. In the timing diagram, the high level represents the existence of a vacuum in the respective chambers. Conversely, the low level indicates an ambient or atmospheric condition in the chamber.

As shown in Table II herein, the positions of the valves for the apparatus during a laminating cycle are shown. In this description, it is understood that the valve referred to are valves A, B1, B2, C1, C2 and D shown in FIG. 2. These solenoid controlled valves are arranged to be normally open. That is, the port to the respective chamber is connected to the positive pressure source 201 (which is normally atmospheric pressure in this embodiment) through the valve. The valves are then repositioned by applying signals to the controlling solenoid.

In a typical arrangement, the exhaust port in valves B2 and C2 are plugged. Moreover, in Table II, the nomenclature is such that a symbol X represents the status wherein the valve is open to the atmosphere cut is closed relative to the vacuum source.

The symbol Z indicates that the valve has been energized, i.e. a signal has been applied to the controlling solenoid, whereupon the valve is open and connects the appropriate chamber to the vacuum source. Likewise, the symbol O indicates that vacuum is maintained in the chamber and the valve remains energized but the chamber is not longer connected to the vacuum source.

The steps in Table II indicate the steps in the laminating procedure or operation as suggested above. Concurrent reference is also made to FIG. 8, the timing diagram for the operating cycle. Thus, the controller 203 (FIG. 2) supplies signals to the controlling mechanisms for the various valves to place the valves in the conditions shown whereby the appropriate pressure or vacuum condition is established in the respective chambers to effect the operating procedure of the apparatus.

TABLE II

VALVE POSITIONS DURING LAMINATING CYCLE

| STEP | A | B1 | B2 | C1 | C2 | D | REMARKS |
|---|---|---|---|---|---|---|---|
| 1 | X | X | X | Z | Z | X | VACUUM PUMP IS ENERGIZED |
| 2 | Z | X | X | Z | Z | X | LOAD |
| 3 | X | X | X | Z | Z | X | GOOD VACUUM IS REQ'D |
| 4 | X | X | X | O | X | X | " |
| 5 | X | Z | Z | O | X | X | " |
| 6 | X | O | X | O | X | X | " |
| 7 | X | O | X | O | X | Z | " |
| 8 | X | O | X | X | X | Z | GOOD VACUUM REQ'D |
| 9 | X | X | X | Z | Z | X | |
| 0 | Z | X | X | Z | Z | X | SAME AS STEP 2-UNLOAD |

Referring now to FIG. 8, there is shown a timing chart to assist in the description of the operation of the apparatus of the instant invention. The chart depicts the operation of the various vacuum valves (see FIG. 2). Also, the chart suggests the operations of the valves in seconds. However, the specifric timing is not limitative of the invention, per se. Moreover, in the chart status, a high line represents an open vavle and a low line represents a closed valve.

In the "neutral position", as shown in FIG. 3 the control panel may or may not be operative. In the same fashion, the vacuum pump need not be energized. That is, initially, the condition of the valves is not important. However, when the apparatus is first turned on, all of the valves are in the open condition wherein atmopsheric pressure exists in each of the chambers in the system. However, in order to begin the operation of the apparatus, as noted, the control panel is rendered operative which causes the vacuum pump to be turned on and all of the valve solenoids are activated and the like. Likewise, the heater elements may be activated at this time, as well. For purposes of this description, the time position P represents the preliminary start-up condition or status.

Thus it is assumed that at time P, the apparatus is functioning either after initilization or as an ongoing function. At time P, valve A is open to atmospheric pressure source 201 while valves B1, B2 and D are closed to the vacuum source 200. Consequently, atmospheric pressure exists in chambers A, B and D. However, valves C1 and C2 are open to connect vacuum source 200 to chamber C. By pulling the vacuum in chamber C through port 62 as shown in FIG. 1, the pressure blanket 8 is drawn into contact with the lower surface of pressure plate 6. This also causes the frame 7/9 to move upwardly into contact with the lower surface of plate 6 wherein the O-ring 93 is compressed and forms an airtight seal to assist in maintaining the vacuum between pressure blanket 8 and pressure plate 6.

The lamination process, per se, begins at time 0. In order to start the operation, valve A is closed to the atmospheric pressure source 201 and is connected to the vacuum pump source 200. Thus, a vacuum is pulled in chamber A whereupon the plates 2 and 3 of bellows 26 are drawn together as shown in FIG. 5. The vacuum in chamber A is drawn through port 29 which passes through plates 1 and 2.

By moving plate 3 of the bellows upwardly, plate 6 is also moved upwardly as well and, because of the vacuum, carries pressure plate 8 together with the frames 7 and 9 therewith.

When a vacuum is pulled in chamber A and the various components including pressure blanket frames 7 and 9 are moved upwardly, the gravity pressure applied thereby to laminating platform 10 is removed. The compression springs 30 push the laminating platform 10 upwardly and thereby freeing the lower surface of the laminating platform 10 from the seal 34. This permits the laminating platform 10 to be removed by sliding outwardly relative to the apparatus on the slide apparatus 37 and the like. While the drawer is outwardly located, the circuit board 400 together with the dry film laminating materials 300 and 301 can be placed on the laminating platform 11 of the drawer which is then returned to the home position within the apparatus. (In the ongoing operation, this situation can be equated with time P in the intialization operation and can be considered as the loading or unloading step in the machine cycle.)

At time 0 (which starts the actual laminating procedure), valve A is closed wherein the connection between chamber A and the vacuum source is broken and atmospheric pressure is returned to chamber A. With this arrangement, the plates 3, 4 and 6 move downwardly under the influence of gravity and the compressions springs 250. In particular, all of these plate components are, effectively, pushed onto the upper surface of the laminating platform 10. The lower surface of the laminating platform 10 is pushed into contact with seal 34 thereby, effectively, closing chamber B. At time 3 (between times 2 and 4), the valve C2 is closed to prevent any bleeding of the vacuum out of chamber C by subsequent actions.

At time 4, the valves B1 and B2 are opened so that a vacuum is drawn in chamber B. With a vacuum in chamber B, the laminating platform 10 is placed in intimate contact with plate 12 and the heating elements 61 associated therewith as shown in FIG. 6. Consequently, heat is transferred to the laminating platform and thereby applies heat to the circuit board the the dry films.

At time 7 (between times 6 and 8), valve B2 is closed to prevent bleeding of the vacuum from chamber B through the vacuum pump or manifold.

At time 8, valve D is opened and vacuum is drawn in chamber D by the vacuum pump 200.

This condition now produces the vacuum dwell and preheat phase of the operation. At this time, the laminating platform 10, the circuit board 400 and the dry films 300 and 301 are preheated.

At time 23, between times 22 and 24, valve C1 is closed and atmospheric pressure is returned to chamber C. With the return of atmospheric pressure, in conjunction with the vacuum which has been pulled in chamber D, the pressure blanket 8 moves quickly and slaps down onto the circuit board and dry film layers as shown in FIG. 7. Thus, the dry film layers are laminated to both sides of the printed circuit board in a vacuum which has been drawn in chamber D.

At time 33, the valves B2 and D are closed wherein atmospheridc pressure is returned simultaneously to chambers B and D. At the same time, valves C1 and C2 are opened to permit a vacuum to be drawn in chamber C by the vacuum pump.

At time 36, valve A is also opened whereupon a vacuum is pulled in chamber A.

With these changes of pressure, it is clear that laminating blanket 8 has been drawn into contact with the lower surface of plate 6, the bellows 26 has contracted and moved all of the plates upwardly and chambers B and D are at atmospheric pressure which has released the laminating platform 10 back to the position shown in FIG. 3. Consequently, the system is in condition to remove the drawer and the printed circuit board during a load/unload operation. This operation continues so long as desired and printed circuit boards with dry film laminated thereto are produced.

In the event that is becomes necessary or undesirable to remove the laminating blanket 8 for cleaning or the like, a vacuum is drawn in chamber A while all other chambers are at atmospheric pressure. Thus, the blanket can be easily removed.

Figure 9:
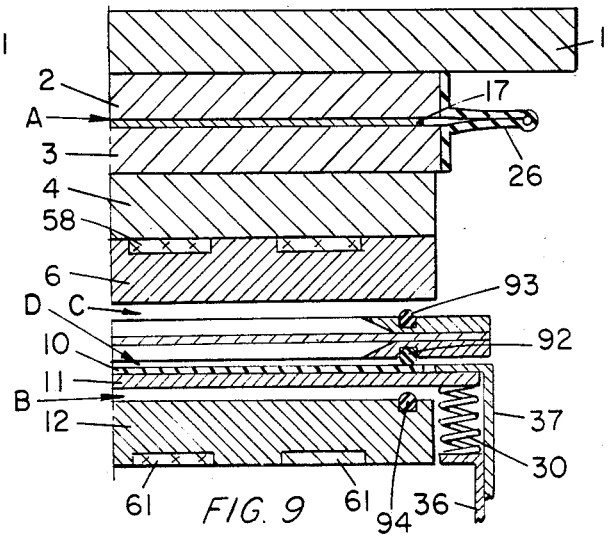
FIG. 9 is a schematic illustrations and partial cross-sectional view of the apparatus in the "open" position.

Referring now to FIG. 9, there is shown the "open" position wherein a vacuum is pulled in chamber A. This causes plates 3, 4 and 6 to be pulled upwardly. Chambers B, C and D are at atmospheric pressure. In this arrangement, the springs 30 push platform 11 upwardly away from pressure plate 12 and seal 34. Thus, the platform 11 and the diaphragm 8, together with frames 7 and 9, are not "captured" in the equipment. In this status, the platform 11 and diaphram can be readily removed from the apparatus for cleaning or replacement.

Figure 10:
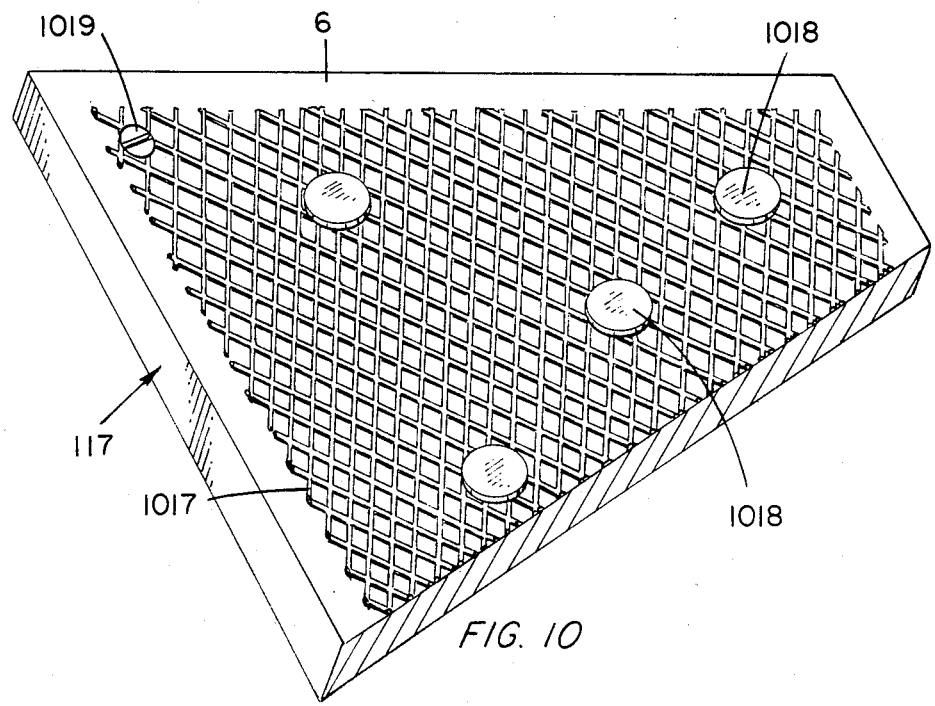
FIG. 10 is a more detailed showing of the spacer element used in the preferred embodiment of the instant invention.

Referring now to FIG. 10, there is shown a more detailed version of the spacer 117. In particular, spacer 117 comprises a sheet 1017 which can be formed of an expanded metal screen, a perforated sheet or the like. In a preferred embodiment, the sheet 1017 can be fabricated of aluminum or other suitable material. The sheet 1017 is, typically, mounted to the lower surface of pressure plate 6 by means of screws or the like (not shown).

In addition, a plurality of standoffs 1018 are affixed to various portions of the sheet 1017. Typically, the standoffs are fabricated of a silicone rubber (which may be reinfored) or any other suitable material. The standoffs 1018 may be affixed to the sheet 1017 in any suitable fashion as, for example, by gluing or adhering with epoxy or the like. The standoffs 1018 may be disposed on both surfaces of the sheet 1017, if desired.

The purpose of the spacer 117 is to permit improved operation of the apparatus. That is, by permitting air to circulate around and through sheet 1017 easily, the possibility of creating a vacuum between the laminated circuit board and the lower surface of the upper pressure plate 6 is prevented. Thus, the laminated board can be readily, easily and quickly removed from the apparatus when the laminating process is completed.

Thus, there is shown and described a unique laminating machine apparatus which is especially useful with regard to lamination of dry films to printed circuit boards. The apparatus is especially adapted to operate quickly, cleanly, and reliably. Because of reheating and laminating action in the vacuum, the possibility of entrapped air bubbles between the printed circuit board and one or more of the film layers is prevented. It is clear that a preferred embodiment of the invention has been described. Thus, those skilled in the art may conceive modifications to the apparatus. However, any such modifications which fall within the purview of this description are intended to be included therein as well. That is, the description herein is intended to be illustrative only and is not intended to be limitative. Rather, the scope of the invention is limited only by the scope of the claims appended thereto.

I claim:

1. A laminating apparatus comprising,
   housing means,
   a laminating platform for supporting elements to be laminated to each other,
   first pressure plate means mounted below said laminating platform,
   second pressure plate means mounted above said laminating platform,
   an upper plate and a lower plate,
   flexible bellows joined to each of said upper and lower plates to define a cavity inside said bellows and between said upper plate and said lower plate,
   said lower plate connected to said second pressure plate means,
   said upper plate connected to said housing means,
   a vacuum means connected to communicate with said cavity,
   thermal means disposed adjacent to said second pressure plate means to selectively apply heat to said second pressure plate means,
   thermal insulator means disposed between said thermal means and said lower plate, diaphragm means disposed between said laminating platform and one of said first and second pressure plate means, first seal means disposed between said diaphragm means and said laminating platform to selectively provide an airtight seal therebetween, second seal means disposed between said diaphragm means and said second pressure plate means to selectively provide an airtight seal therebetween, third seal means disposed between said laminating platform and said first pressure plate means to selectively provide an airtight seal therebetween, a plurality of channels connected to said vacuum means in order to permit vacuum to be selectively drawn on opposite sides of said laminating platform and in said bellows means, and said vacuum means also connected for selectively producing a low pressure condition between said diaphragm means and one of said first and second pressure plate means thereby to position said diaphragm closely adjacent to said laminating platform, said first pressure plate means or said second pressure plate means as determined by the production of a low pressure condition.

2. The laminating apparatus recited in claim 1 including,
frame means surrounding said diaphragm means to provide support therefore.

3. The laminating apparatus recited in claim 1 including,
second thermal means disposed adjacent o said first pressure plate means in order to selectively applyheat to said first pressure plate means.

4. The laminating apparatus recited in claim 3 including
thermal insulator means disposed between said second thermal means and said first pressure plate means.

5. The laminating apparatus recited in claim 1 including,
said bellows selectively operative to move said second pressure plate means toward or away from said laminating platform.

6. The laminating apparatus recited in claim 5 wherein,
said bellows means is connected to said vacuum means whereby said bellows means is selectively operated.

7. The laminating apparatus recited in claim 1 including,
slide means,
said diaphragm means connected to said slide means wherein said diaphragm means can selectively slide between said first and second pressure plate means.

8. The laminating apparatus recited in claim 1 wherein,
said diaphragm means comprises a flexible membrane.

9. The laminating apparatus recited in claim 7 including,
resilient means interposed between said housing means and said second pressure plate means to impart force to move said second pressure plate means away from said housing means.

10. The laminating apparatus recited in claim 9, wherein,
said resilient means comprises coil springs compressed between said housing means and said second pressure plate means.

11. The laminating apparatus recited in claim 9 wherein,
said upper plate and said lower plate are each circular in configuration.

12. The laminating apparatus recited in claim 3 wherein,
each of said first and second thermal means include heating strips mounted at said first and second pressure plate means.

13. The laminating apparatus recited in claim 1 including,
controller means for controlling said vacuum means to determine when a low pressure condition is supplied.

14. The laminating apparatus recited in claim 13 wherein,
said controller means includes valve means for selectively disconnecting said vacuum means from said laminating apparatus.

15. A laminating apparatus comprising,
a laminating platform for supporting elements to be laminated to each other,
first pressure plate means mounted below said laminating platform,
second pressure plate means mounted above said laminating platform,
spring means mounted to impart force to move said second pressure plate means toward said laminating platform,
thermal means disposed adjacent to said first and second pressure plates to selectively apply heat to said first and second pressure plates,
thermal insulator means disposed between said thermal means and the respective pressure plates associated therewith,
diaphragm means disposed between said laminating platform and one of said first and second pressure plate,
first seal means disposed between said diaphragm means and said laminating platform to to define a first cavity and selectively provide an airtight seal therefor,
second seal means disposed between said diaphragm means and said second pressure plate to define a second cavity and selectively provide an airtight seal therefor,
third seal means disposed between said laminating platform and said first pressure plate to define a third cavity and selectively provide an airtight seal therefor,
vacuum means for selectively producing a low pressure condition between said diaphragm means and one of said first and second pressure plates thereby to position said diaphragm closely adjacent to said laminating platform, said first pressure plate means or said second pressure plate means as determined by the production of a low pressure condition,
adjustment means including an upper plate, a lower plate, and flexible bellows joined to the perimeters of each of said upper and lower plates to define a fourth cavity inside said bellows and between said upper plate and said lower plate,
said vacuum means connected to communicate with said fourth cavity,
slide means, said diaphragm means connected to said slide means wherein said diaphragm means can selectively slide between said first and second pressure plate means, and frame means surrounding said diaphragm means to provide support therefore.

16. The apparatus recited in claim 1 including, perforated plate means disposed within said flexible bellows and between said upper and lower plates.

* * * * *